Figure 1A:
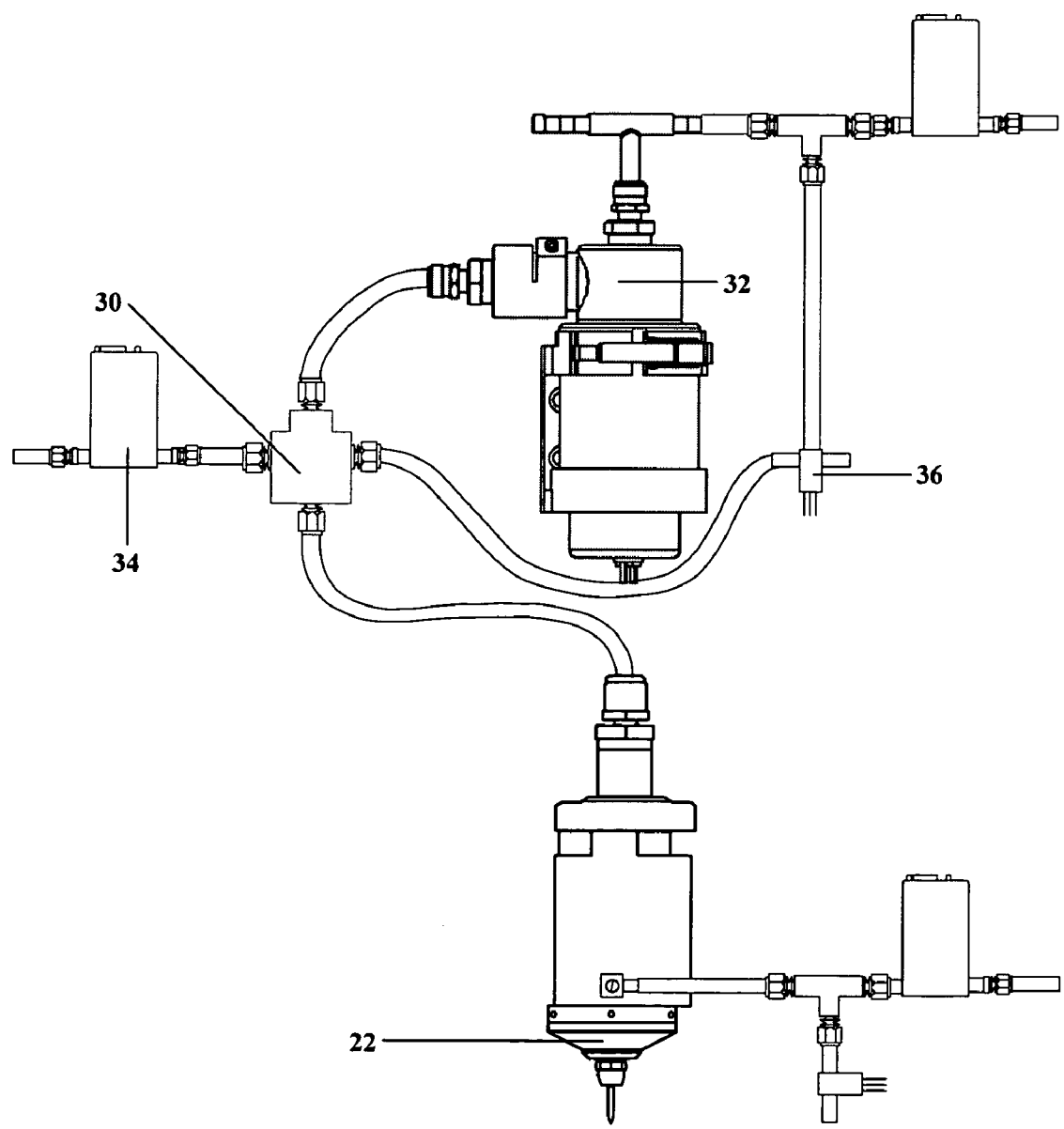

US007674671B2

(12) United States Patent
Renn et al.

(10) Patent No.: US 7,674,671 B2
(45) **Date of Patent: *Mar. 9, 2010**

(54) AERODYNAMIC JETTING OF AEROSOLIZED FLUIDS FOR FABRICATION OF PASSIVE STRUCTURES

(75) Inventors: Michael J. Renn, Hudson, WI (US); Marcelino Essien, Cedar Crest, NM (US); Bruce H. King, Albuquerque, NM (US); Jason A. Paulsen, Centerville, MN (US)

(73) Assignee: Optomec Design Company, Albuquerque, NM (US)

( * ) Notice: Subject to any disclaimer, the term of this patent is extended or adjusted under 35 U.S.C. 154(b) by 255 days.

This patent is subject to a terminal disclaimer.

(21) Appl. No.: 11/302,481

(22) Filed: Dec. 12, 2005

(65) Prior Publication Data

US 2006/0163570 A1 Jul. 27, 2006

Related U.S. Application Data

(60) Provisional application No. 60/635,848, filed on Dec. 13, 2004.

(51) Int. Cl.
*H01L 21/8234* (2006.01)

(52) U.S. Cl. ....................... 438/238; 438/382; 438/763; 438/782

(58) Field of Classification Search ......... 438/759–799, 438/238, 381–382
See application file for complete search history.

(56) References Cited

U.S. PATENT DOCUMENTS

| | | | |
|---|---|---|---|
| 3,590,477 | A | 7/1971 | Cheroff et al. |
| 3,715,785 | A | 2/1973 | Brown et al. |
| 3,808,432 | A | 4/1974 | Ashkin |
| 3,808,550 | A | 4/1974 | Ashkin |
| 3,846,661 | A | 11/1974 | Brown et al. |
| 3,854,321 | A | 12/1974 | Dahneke |
| 3,901,798 | A | 8/1975 | Peterson |
| 3,959,798 | A | 5/1976 | Hochberg et al. |
| 3,974,769 | A | 8/1976 | Hochberg et al. |
| 3,982,251 | A | 9/1976 | Hochberg |
| 4,016,417 | A | 4/1977 | Benton |

(Continued)

FOREIGN PATENT DOCUMENTS

| | | | |
|---|---|---|---|
| EP | 0 331 022 | A2 | 9/1989 |
| EP | 0 444 550 | A2 | 9/1991 |
| EP | 0470911 | | 7/1994 |
| JP | 2007-507114 | | 3/2007 |
| KR | 10-2007-0008614 | | 1/2007 |
| KR | 10-2007-0008621 | | 1/2007 |
| WO | WO 00/23825 | | 4/2000 |
| WO | WO 00/69235 | | 11/2000 |
| WO | WO-01/83101 | A1 | 11/2001 |
| WO | WO 2006/041657 | A2 | 4/2006 |
| WO | WO 2006/065978 | A2 | 6/2006 |

OTHER PUBLICATIONS

Fernandez De La Mora, J. et al., "Aerodynamic focusing of particles in a carrier gas", *J. Fluid Mech.* vol. 195, printed in Great Britain 1988, 1-21.

(Continued)

*Primary Examiner*—H. Jey Tsai
(74) *Attorney, Agent, or Firm*—Philip D. Askenazy; Peacock Myers, P.C.

(57) ABSTRACT

Method and apparatus for direct writing of passive structures having a tolerance of 5% or less in one or more physical, electrical, chemical, or optical properties. The present apparatus is capable of extended deposition times. The apparatus may be configured for unassisted operation and uses sensors and feedback loops to detect physical characteristics of the system to identify and maintain optimum process parameters.

11 Claims, 12 Drawing Sheets

U.S. PATENT DOCUMENTS

| | | | |
|---|---|---|---|
| 4,019,188 A | 4/1977 | Hochberg | |
| 4,034,025 A | 7/1977 | Martner | |
| 4,046,073 A | 9/1977 | Mitchell et al. | |
| 4,046,074 A | 9/1977 | Hochberg et al. | |
| 4,092,535 A | 5/1978 | Ashkin et al. | |
| 4,112,437 A | 9/1978 | Mir et al. | |
| 4,132,894 A | 1/1979 | Yule | |
| 4,171,096 A | 10/1979 | Welsh et al. | |
| 4,200,660 A | 4/1980 | Schaefer et al. | |
| 4,228,440 A | 10/1980 | Horike et al. | |
| 4,269,868 A | 5/1981 | Livsey | |
| 4,323,756 A | 4/1982 | Brown et al. | |
| 4,453,803 A | 6/1984 | Hidaka et al. | |
| 4,485,387 A | 11/1984 | Drumheller | |
| 4,497,692 A | 2/1985 | Gelchinski et al. | |
| 4,601,921 A | 7/1986 | Lee | |
| 4,605,574 A | 8/1986 | Yonehara et al. | |
| 4,670,135 A | 6/1987 | Marple et al. | |
| 4,689,052 A | 8/1987 | Ogren et al. | |
| 4,825,299 A | 4/1989 | Okada et al. | |
| 4,826,583 A | 5/1989 | Biernaux et al. | |
| 4,893,886 A | 1/1990 | Ashkin et al. | |
| 4,904,621 A | 2/1990 | Loewenstein et al. | |
| 4,911,365 A | 3/1990 | Thiel et al. | |
| 4,920,254 A | 4/1990 | DeCamp et al. | |
| 4,947,463 A | 8/1990 | Matsuda et al. | |
| 4,997,809 A | 3/1991 | Gupta | |
| 5,032,850 A | 7/1991 | Andeen et al. | |
| 5,043,548 A | 8/1991 | Whitney et al. | |
| 5,064,685 A | 11/1991 | Kestenbaum et al. | |
| 5,164,535 A | 11/1992 | Leasure | |
| 5,170,890 A | 12/1992 | Wilson et al. | |
| 5,176,744 A | 1/1993 | Muller | |
| 5,182,430 A | 1/1993 | Lagain | |
| 5,194,297 A * | 3/1993 | Scheer et al. | 427/180 |
| 5,208,431 A | 5/1993 | Uchiyama et al. | |
| 5,245,404 A | 9/1993 | Jannson et al. | |
| 5,250,383 A | 10/1993 | Naruse | |
| 5,254,832 A | 10/1993 | Gartner et al. | |
| 5,270,542 A | 12/1993 | McMurry et al. | |
| 5,292,418 A | 3/1994 | Morita et al. | |
| 5,322,221 A | 6/1994 | Anderson | |
| 5,335,000 A | 8/1994 | Stevens | |
| 5,344,676 A | 9/1994 | Kim et al. | |
| 5,366,559 A | 11/1994 | Periasamy | |
| 5,378,505 A | 1/1995 | Kubota et al. | |
| 5,378,508 A | 1/1995 | Castro et al. | |
| 5,403,617 A | 4/1995 | Haaland | |
| 5,449,536 A | 9/1995 | Funkhouser | |
| 5,486,676 A | 1/1996 | Aleshin | |
| 5,495,105 A | 2/1996 | Nishimura et al. | |
| 5,512,745 A | 4/1996 | Finer et al. | |
| 5,607,730 A | 3/1997 | Ranalli | |
| 5,609,921 A | 3/1997 | Gitzhofer et al. | |
| 5,612,099 A | 3/1997 | Thaler | |
| 5,614,252 A | 3/1997 | McMillan et al. | |
| 5,648,127 A | 7/1997 | Turchan et al. | |
| 5,676,719 A | 10/1997 | Stavropoulos et al. | |
| 5,733,609 A | 3/1998 | Wang | |
| 5,736,195 A | 4/1998 | Haaland | |
| 5,770,272 A | 6/1998 | Biemann et al. | |
| 5,772,106 A | 6/1998 | Ayers et al. | |
| 5,814,152 A | 9/1998 | Thaler | |
| 5,844,192 A | 12/1998 | Wright et al. | |
| 5,854,311 A | 12/1998 | Richart | |
| 5,861,136 A | 1/1999 | Glicksman et al. | |
| 5,882,722 A | 3/1999 | Kydd | |
| 5,894,403 A | 4/1999 | Shah et al. | |
| 5,940,099 A | 8/1999 | Karlinski | |
| 5,958,268 A | 9/1999 | Engelsberg et al. | |
| 5,965,212 A | 10/1999 | Dobson et al. | |
| 5,980,998 A | 11/1999 | Sharma et al. | |
| 5,993,549 A | 11/1999 | Kindler et al. | |
| 5,997,956 A | 12/1999 | Hunt et al. | |
| 6,007,631 A | 12/1999 | Prentice et al. | |
| 6,015,083 A | 1/2000 | Hayes et al. | |
| 6,025,037 A | 2/2000 | Wadman et al. | |
| 6,036,889 A | 3/2000 | Kydd | |
| 6,110,144 A | 8/2000 | Choh et al. | |
| 6,116,718 A | 9/2000 | Peeters et al. | |
| 6,136,442 A | 10/2000 | Wong | |
| 6,151,435 A | 11/2000 | Pilloff | |
| 6,159,749 A | 12/2000 | Liu | |
| 6,182,688 B1 | 2/2001 | Fabre | |
| 6,197,366 B1 | 3/2001 | Takamatsu | |
| 6,251,488 B1 | 6/2001 | Miller et al. | |
| 6,258,733 B1 | 7/2001 | Solayappan et al. | |
| 6,265,050 B1 | 7/2001 | Wong et al. | |
| 6,290,342 B1 | 9/2001 | Vo et al. | |
| 6,291,088 B1 | 9/2001 | Wong | |
| 6,293,659 B1 | 9/2001 | Floyd et al. | |
| 6,340,216 B1 | 1/2002 | Peeters et al. | |
| 6,348,687 B1 | 2/2002 | Brockmann et al. | |
| 6,349,668 B1 * | 2/2002 | Sun et al. | 118/723 R |
| 6,379,745 B1 | 4/2002 | Kydd et al. | |
| 6,390,115 B1 | 5/2002 | Rohwer et al. | |
| 6,406,137 B1 | 6/2002 | Okazaki et al. | |
| 6,416,156 B1 | 7/2002 | Noolandi et al. | |
| 6,416,157 B1 | 7/2002 | Peeters et al. | |
| 6,416,158 B1 | 7/2002 | Floyd et al. | |
| 6,416,159 B1 | 7/2002 | Floyd et al. | |
| 6,416,389 B1 | 7/2002 | Perry et al. | |
| 6,454,384 B1 | 9/2002 | Peeters et al. | |
| 6,467,862 B1 | 10/2002 | Peeters et al. | |
| 6,471,327 B2 | 10/2002 | Jagannathan et al. | |
| 6,481,074 B1 | 11/2002 | Karlinski | |
| 6,503,831 B2 | 1/2003 | Speakman | |
| 6,513,736 B1 | 2/2003 | Skeath et al. | |
| 6,521,297 B2 | 2/2003 | McDougall et al. | |
| 6,537,501 B1 | 3/2003 | Holl et al. | |
| 6,544,599 B1 | 4/2003 | Brown et al. | |
| 6,548,122 B1 | 4/2003 | Sharma et al. | |
| 6,573,491 B1 | 6/2003 | Marchitto et al. | |
| 6,607,597 B2 | 8/2003 | James et al. | |
| 6,636,676 B1 | 10/2003 | Renn | |
| 6,646,253 B1 | 11/2003 | Rohwer et al. | |
| 6,780,377 B2 | 8/2004 | Hall et al. | |
| 6,811,805 B2 | 11/2004 | Gilliard et al. | |
| 6,832,124 B2 | 11/2004 | Renn et al. | |
| 6,890,624 B1 | 5/2005 | Kambe et al. | |
| 6,921,626 B2 | 7/2005 | Ray et al. | |
| 7,045,015 B2 | 5/2006 | Renn et al. | |
| 7,108,894 B2 | 9/2006 | Renn | |
| 7,270,844 B2 | 9/2007 | Renn | |
| 7,294,366 B2 | 11/2007 | Renn et al. | |
| 7,485,345 B2 | 2/2009 | Renn et al. | |
| 2001/0046551 A1 * | 11/2001 | Falck et al. | 427/8 |
| 2002/0012743 A1 | 1/2002 | Sampath et al. | |
| 2002/0096647 A1 | 7/2002 | Moors et al. | |
| 2002/0100416 A1 | 8/2002 | Sun et al. | |
| 2002/0132051 A1 | 9/2002 | Choy | |
| 2002/0162974 A1 | 11/2002 | Orsini et al. | |
| 2003/0003241 A1 | 1/2003 | Suzuki et al. | |
| 2003/0020768 A1 | 1/2003 | Renn | |
| 2003/0048314 A1 | 3/2003 | Renn | |
| 2003/0108511 A1 | 6/2003 | Sawhney | |
| 2003/0108664 A1 | 6/2003 | Kodas et al. | |
| 2003/0117691 A1 | 6/2003 | Bi et al. | |
| 2003/0138967 A1 | 7/2003 | Hall et al. | |
| 2003/0175411 A1 | 9/2003 | Kodas et al. | |
| 2003/0180451 A1 | 9/2003 | Kodas et al. | |
| 2003/0202043 A1 | 10/2003 | Moffat et al. | |
| 2003/0219923 A1 | 11/2003 | Nathan et al. | |
| 2003/0228124 A1 * | 12/2003 | Renn et al. | 385/147 |

| | | |
|---|---|---|
| 2004/0004209 A1 | 1/2004 | Matsuba et al. |
| 2004/0029706 A1 | 2/2004 | Barrera et al. |
| 2004/0038808 A1 | 2/2004 | Hampden-Smith et al. |
| 2004/0080917 A1 | 4/2004 | Steddom et al. |
| 2004/0151978 A1 | 8/2004 | Huang |
| 2004/0179808 A1 | 9/2004 | Renn |
| 2004/0185388 A1 | 9/2004 | Hirai |
| 2004/0191695 A1 | 9/2004 | Ray et al. |
| 2004/0197493 A1 | 10/2004 | Renn et al. |
| 2004/0247782 A1* | 12/2004 | Hampden-Smith et al. .. 427/180 |
| 2005/0110064 A1 | 5/2005 | Duan et al. |
| 2005/0129383 A1 | 6/2005 | Renn et al. |
| 2005/0145968 A1 | 7/2005 | Goela et al. |
| 2005/0147749 A1 | 7/2005 | Liu et al. |
| 2005/0156991 A1 | 7/2005 | Renn |
| 2005/0163917 A1 | 7/2005 | Renn |
| 2005/0184328 A1 | 8/2005 | Uchiyama et al. |
| 2005/0214480 A1 | 9/2005 | Garbar et al. |
| 2005/0215689 A1 | 9/2005 | Garbar et al. |
| 2005/0238804 A1 | 10/2005 | Garbar et al. |
| 2006/0008590 A1 | 1/2006 | King et al. |
| 2006/0175431 A1 | 8/2006 | Renn et al. |
| 2006/0233953 A1 | 10/2006 | Renn et al. |
| 2006/0280866 A1 | 12/2006 | Marquez et al. |
| 2007/0019028 A1 | 1/2007 | Renn et al. |
| 2009/0114151 A1 | 5/2009 | Renn et al. |

OTHER PUBLICATIONS

King, Bruce et al., "M3D TM Technology: Maskless Mesoscale TM Materials Deposition", *Optomec pamphlet* 2001.

Miller, Doyle et al., "Maskless Mesoscale Materials Deposition", *HDI* vol. 4, No. 9 Sep. 2001, 1-3.

Rao, N. P. et al., "Aerodynamic Focusing of Particles in Viscous Jets", *J. Aerosol Sci.* vol. 24, No. 7, Pergamon Press, Ltd., Great Britain 1993, 879-892.

Renn, Michael J. et al., "Flow- and Laser-Guided Direct Write of Electronic and Biological Components", *Direct-Write Technologies for Rapid Prototyping Applications* Academic Press 2002, 475-492.

Zhang, Xuefeng et al., "A Numerical Characterization of Particle Beam Collimation by an Aerodynamic Lens-Nozzle System: Part I. An Individual Lens or Nozzle", *Aerosol Science and Technology* vol. 36, Taylor and Francis 2002, 617-631.

*Webster's Ninth New Collegiate Dictionary*, Merriam-Webster, Inc., Springifled, MA. USA, (1990), 744.

Ashkin, A, "Acceleration and Trapping of Particles by Radiation Pressure", *Physical Review Letters*, (Jan. 26, 1970),156-159.

Ashkin, A. , "Optical trapping and manipulation of single cells using infrared laser beams", *Nature*, (Dec. 1987),769-771.

Dykhuizen, R. C., "Impact of High Velocity Cold Spray Particles", (May 13, 2000),1-18.

Lewandowski, H. J., et al., "Laser Guiding of Microscopic Particles in Hollow Optical Fibers", *Announcer 27, Summer Meeting—Invited and Contributed Abstracts*, (Jul. 1997),89.

Marple, V. A., et al., "Inertial, Gravitational, Centrifugal, and Thermal Collection Techniques", *Aerosol Measurement: Principles, Techniques and Applications*, (2001),229-260.

Odde, D. J., et al., "Laser-Based Guidance of Cells Through Hollow Optical Fibers", *The American Society for Cell Biology Thirty-Seventh Annual Meeting*, (Dec. 17, 1997).

Odde, D. J., et al., "Laser-guided direct writing for applications in biotechnology", *Trends in Biotechnology*, (Oct. 1999),385-389.

Renn, M. J., et al., "Evanescent-wave guiding of atoms in hollow optical fibers", *Physical Review A*, (Feb. 1996),R648-R651.

Renn, M. J., et al., "Laser-Guidance and Trapping of Mesoscale Particles in Hollow-Core Optical Fibers", *Physical Review Letters*, (Feb. 15, 1999),1574-1577.

Renn, M. J., et al., "Laser-Guided Atoms in Hollow-Core Optical Fibers", *Physical Review Letters*, (Oct. 30, 1995),3253-3256.

Renn, M. J., et al., "Optical-dipole-force fiber guiding and heating of atoms", *Physical Review A*, (May 1997),3684-3696.

Renn, M. J., et al., "Particle manipulation and surface patterning by laser guidance", *Journal of Vacuum Science& Technology B*, (Nov./Dec. 1998),3859-3863.

Renn, M. J., et al., "Particle Manipulation and Surface Patterning by Laser Guidance", *Submitted to EIPBN '98, Session AM4*, (1998).

Sobeck, et al., *Technical Digest: 1994 Solid-State Sensor and Actuator Workshop*, (1994),647.

Vanheusden, K. , et al., "Direct Printing of Interconnect Materials for Organic Electronics", *IMAPS ATW, Printing an Intelligent Future*, (Mar. 8-10, 2002),1-5.

* cited by examiner

AERODYNAMIC JETTING OF AEROSOLIZED FLUIDS FOR FABRICATION OF PASSIVE STRUCTURES

CROSS-REFERENCE TO RELATED APPLICATIONS

This application claims the benefit of the filing of U.S. Provisional Patent Application Ser. No. 60/635,848, entitled "Solution-Based Aerosol Jetting of Passive Electronic Structures" filed on Dec. 13, 2004, and the specification thereof is incorporated herein by reference.

BACKGROUND OF THE INVENTION

1. Field of the Invention (Technical Field)

The present invention relates generally to the field of direct deposition of passive structures. More specifically, the invention relates to the field of maskless, precision deposition of mesoscale passive structures onto planar or non-planar targets, with an emphasis on deposition of precision resistive structures.

2. Background Art

Note that the following discussion refers to a number of publications and references. Discussion of such publications herein is given for more complete background of the scientific principles and is not to be construed as an admission that such publications are prior art for patentability determination purposes.

Various methods for deposition of passive structures exist, however, thick film and thin film methods have played a dominant role in the deposition of passive structures, including but not limited to resistors or capacitors, onto various electronic and microelectronic targets. By way of example, the thick film technique typically uses a screen-printing process to deposit electronic pastes with linewidths as small as 100 microns. Thin film methods for the printing of electronic structures include vapor deposition techniques, such as chemical vapor deposition and laser-assisted chemical vapor deposition, as well as physical deposition techniques, such as sputtering and evaporation.

U.S. Pat. No. 4,938,997 discloses a method for the fabrication of thick film resistors on ceramic substrates, with tolerances consistent with those required for microelectronic circuitry. In this method, a ruthenium-based resistor material is screen printed onto the substrate and fired at temperatures in excess of 850° C. U.S. Pat. No. 6,709,944 discloses a method for fabrication of passive structures on flexible substrates by using ion bombardment to activate the surface of a substrate such as polyimide, forming a graphite-like carbon region that may be combined with another deposited material—such as titanium—to form a passive structure. U.S. Pat. No. 6,713,399 discloses a method for the fabrication of embedded resistors on printed circuit boards. The method uses a thin film process to form embedded passive structures in recesses that have been formed in a conductive layer. The method of U.S. Pat. No. 6,713,399 discloses a process that eliminates the high resistance variation seen in polymer thick film embedded resistors.

While thick film and thin film methods of passive structure fabrication are well-developed, these processes may be unsuitable for certain deposition applications. Some disadvantages of thick film processes are the relatively large minimum linewidths that are characteristic of the technique, the need for mask utilization, and the need for high-temperature processing of the deposited material. The disadvantages of typical thin film processes include the need to use masks, vacuum atmospheres, and multi-step photolithographic processes.

In contrast with conventional methods for deposition of passive structures, the M$^3$D® process is a direct printing technique that does not require the use of vacuum chambers, masks, or extensive post-deposition processing. Commonly-owned International Patent Application Number PCT/US01/14841, published as WO 02/04698 and incorporated herein by reference, discloses a method for using an aerosol jet to deposit passive structures onto various targets, but gives no provision for lowering the tolerance of deposited structures to levels that are acceptable for manufacturing of electronic components. Indeed, the use of a virtual impactor in the invention disclosed therein eventually leads to failure of the system due to the accumulation of particles in the interior of the device. As a result, the maximum runtime before failure of the previously disclosed system is 15 to 100 minutes, with the electrical tolerances of deposited structures of approximately 10% to 30%.

Contrastingly, the present invention can deposit passive structures with conductance, resistance, capacitance, or inductance values with tolerances of less than 5%, and runtimes of several hours.

SUMMARY OF THE INVENTION

The present invention is an apparatus for depositing a passive structure comprising a material on a target, the apparatus comprising an atomizer for forming an aerosol comprising the material and a carrier gas, an exhaust flow controller for exhausting excess carrier gas, a deposition head for entraining the aerosol in a cylindrical sheath gas flow, a pressure sensing transducer, a cross connecting the atomizer, the deposition head, the exhaust flow controller, and the transducer, wherein the tolerance of a desired property of the passive structure is better than approximately 5%. The deposition head and atomizer are preferably connected to the cross at inlets opposite each other. The exhaust flow controller preferably exhausts excess carrier gas at a direction perpendicular to an aerosol direction of travel through the cross. The exhaust flow controller preferably reduces the carrier gas flowrate.

The apparatus preferably further comprises a processor for receiving data from the transducer, the processor determining if a leak or clog is present in the apparatus. In such case the apparatus preferably further comprises a feedback loop for automatically purging the apparatus if a clog is detected or automatically ceasing operation of the apparatus if a leak is detected. The apparatus preferably further comprises a laser whose beam passes through the flowing aerosol and a photodiode for detecting scattered light from the laser. The laser beam is preferably perpendicular to the flow direction of the aerosol and the photodiode is preferably oriented orthogonally to both the laser beam and the flow direction. The photodiode is preferably connected to a controller for automatically controlling the atomizer power.

The invention is also a method of depositing a passive structure comprising a material on a target, the method comprising the steps of: atomizing the material; entraining the atomized material in a carrier gas to form an aerosol; removing excess carrier gas from the aerosol via an opening oriented perpendicularly to a flow direction of the aerosol; monitoring a pressure of said aerosol; surrounding the aerosol with a sheath gas; and depositing the material on the target; wherein a tolerance of a desired property of the passive structure is better than approximately 5%. The method preferably further comprises the steps of determining the existence of a leak or clog based on a value of the pressure, and automatically purging the system if a clog exists or automatically ceasing operation if a leak exists. The method preferably further comprises the steps of shining a laser beam into the aerosol and measuring scattered light from the laser beam. The measuring step is preferably performed by a detector oriented orthogonally to both the laser beam and a flow direction of the aerosol. The method preferably further comprises the step of varying the power used in the atomizing step based on an amount of scattered light detected in the measuring step.

The method preferably further comprises the step of processing the material, the processing step preferably selected from the group consisting of humidifying the aerosol, drying the aerosol, heating the aerosol, heating the deposited material, irradiating the deposited material with a laser beam, and combinations thereof. Irradiating the deposited material with a laser beam preferably enables a linewidth of the deposited material to be as low as approximately 1 micron. Irradiating the deposited material with a laser beam preferably does not raise an average temperature of the target to above a damage threshold.

An object of the present invention is to pre-process a material in flight and/or post processing treatment the material after its deposition on a target resulting in a physical and/or electrical property having a value near that of a bulk material.

Another object of the present invention is to provide a deposition apparatus which is capable of long runtimes.

An advantage of the present invention is that deposited passive structures have conductance, resistance, capacitance, or inductance values with tolerances of less than 5%.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

A BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIG. 1*a* is a schematic of the embodiment of the preferred M$^3$D® apparatus of the present invention capable of extended runtimes and depositing passive structures with tolerances below 5%.

FIG. 1*b* shows the general embodiment of the preferred M$^3$D® apparatus of the present invention, configured for pneumatic atomization.

FIG. 2 is a graph showing the relationship between sheath gas pressure and total gas flow rate.

FIG. 3*a* is a schematic of a cross section of a passive structure with terminations. The height of the structure is $t_1$.

FIG. 3*b* is a schematic of FIG. 3*a*, with an additively trimmed passive structure. The height of the structure is $t_2$, where $t_2 > t_1$.

FIG. 4 is a schematic showing that the rightmost resistor has a greater resistance than the middle structure, by virtue of the greater length of resistor material between the pads.

FIG. 5*a* is a schematic of a ladder resistor prior to direct write of additional passive structures.

FIG. 5*b* is a schematic of a ladder resistor showing how structures can be added after the board has been processed and populated with other components, thereby tuning a circuit after it is mostly complete.

FIG. 6 is a schematic of a passive structure written over the edge of a target.

FIG. 7*a* is a schematic of a linear passive trace with terminated resistors.

FIG. 7*b* is a schematic of a serpentine passive trace with terminated resistors.

FIG. 8 is a schematic of a resistor embedded in a via between two circuit layers.

FIG. 9 depicts a method for depositing a coating on the walls and bottom of a via.

FIGS. 10*a-c* are schematics using the M$^3$D® process in a hybrid additive/subtractive technique to fabricate precision metal structures using an etch resist.

DESCRIPTION OF THE PREFERRED EMBODIMENTS

BEST MODES FOR CARRYING OUT THE INVENTION

Introduction and General Description

The M$^3$D® process is an additive direct printing technology that operates in an ambient environment, and eliminates the need for lithographic or vacuum deposition techniques. The method is capable of depositing a passive electronic component in a predetermined pattern, and uses aerodynamic focusing of an aerosol stream to deposit patterns onto a planar or non-planar target without the use of masks or modified environments. The M$^3$D® method is compatible with commercial thick film and polymer thick film paste compositions, and may also be used with liquid precursor-based formulations, particle-based formulations, and formulations consisting of a combination of particles and liquid precursors. The method is also capable of depositing multiple formulations onto the same target layer. This capability enables direct deposition of resistive structures with a large range of resistance values—ranging from under 50 Ω/square to over 500 KΩ/square—onto the same layer.

The M$^3$D® method is capable of blending different formulations, for example one low-value and one high-value composition, in-transit, in a method in which multiple atomizers are preferably used to aerosolize the two compositions. The formulations are preferably deposited through a single deposition head, and blending may occur during aerosol transport, or when the aerosol droplets combine on the target. This method allows for automated tailoring of a formulation, allowing for the resistivity, or other electrical, thermal, optical, or chemical property of the deposit, to be continuously varied from the low value to the high value. The blending process can also be applied to pastes, inks, various fluids (including, but not limited to, chemical precursor solutions, particle suspensions of electronic, optical, biological and biocompatible materials, adhesives), and combinations thereof.

As used throughout the specification and claims, "passive structure" means a structure having a desired electrical, magnetic, or other property, including but not limited to a conductor, resistor, capacitor, inductor, insulator, dielectric, suppressor, filter, varistor, ferromagnet, adhesive, and the like.

The M³D™ process preferably deposits material in an aerosolized form. Aerosolization of most particle suspensions is peferably performed using a pneumatic device, such as a nebulizer, however ultrasonic aerosolization may be used for particle suspensions consisting of small particles or low-density particles. In this case, the solid particles may be suspended in water or an organic solvent and additives that maintain the suspension. The two atomization methods allow for the generation of droplets or droplet/particles with sizes typically in, but not limited to, the 1-5 micron size range.

Ultrasonically aerosolized compositions typically have viscosities ranging from 1-10 cP. Precursor and precursor/particle compositions typically have viscosities of 10-100 cP, and are preferably aerosolized pneumatically. Compositions with viscosities of 100-1000 cP are also preferably pneumatically aerosolized. Using a suitable diluent, compositions with viscosities greater than 1000 cP may be modified to a viscosity suitable for pneumatic aerosolization.

Figure 1B:
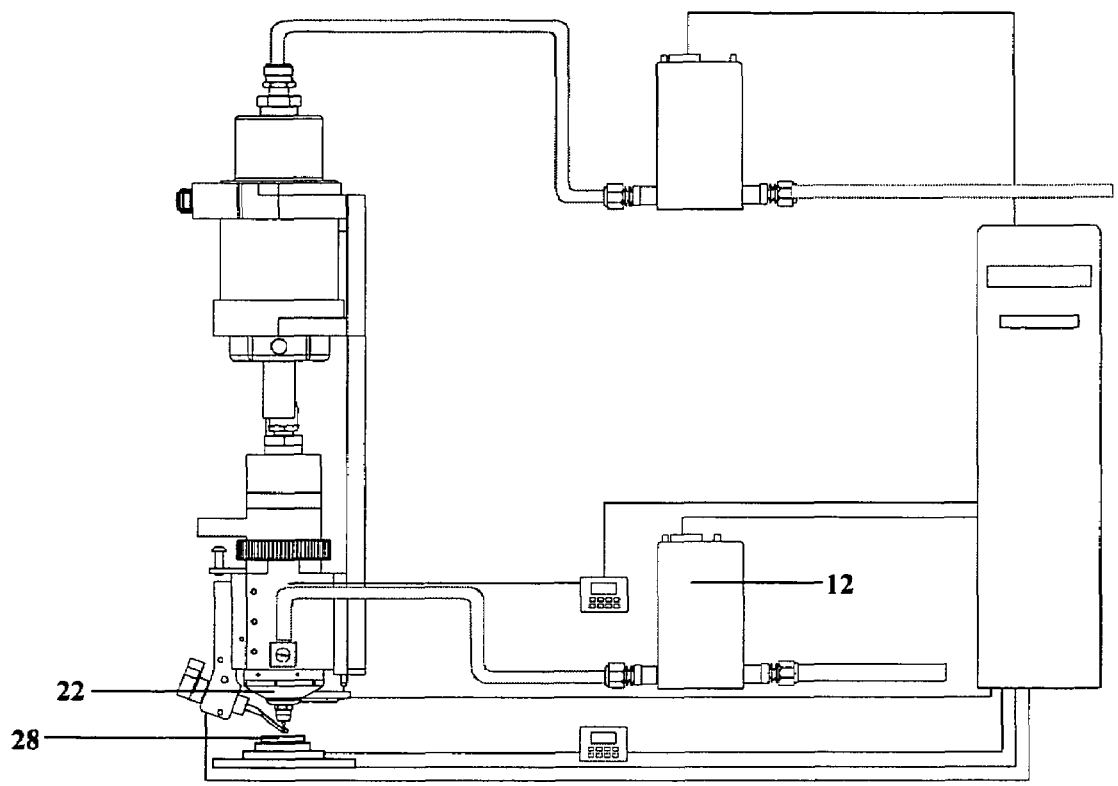

The preferred apparatus of the present invention, which is capable of depositing passive structures having tolerances below 5% with extended runtimes, is shown in FIG. 1a. FIG. 1b shows the M³D® apparatus configured for pneumatic atomization, and details the most general embodiment of the apparatus. An inert carrier gas or carrier fluid is preferably used to deliver the aerosolized sample to the deposition module. In the case of ultrasonic atomization, the aerosol-laden carrier gas preferably enters the deposition head immediately after the aerosolization process. The carrier gas may comprise compressed air, an inert gas (which may comprise a solvent vapor), or a mixture of both. The pneumatic aerosolization process requires a carrier gas flow rate that preferably exceeds the maximum allowable gas flow rate through deposition head 22. To enable the use of large carrier gas flow rates (for example, approximately 0.2 to 2 liter/min), a virtual impactor is preferably used to reduce the flowrate of the carrier gas, without appreciable loss of particles or droplets. The number of stages used in the virtual impactor may vary, and is dependent on the amount of carrier gas that must be removed. The stream is introduced into the M³D® deposition head, where an annular flow is developed, consisting of an inner aerosol stream surrounded by a sheath gas. The co-flowing configuration is capable of focusing the aerosol stream to approximately one-tenth the size of the orifice diameter.

When fabricating passive structures using an annular flow, the aerosol stream preferably enters through ports mounted on deposition head 22 and is directed towards the orifice. Aerosol carrier gas flow controller 10 preferably controls the mass throughput. Inside the deposition head, the aerosol stream is preferably initially collimated by passing through a millimeter-size orifice. The emergent particle stream is then combined with a sheath gas or fluid, forming an annular distribution consisting of an inner aerosol-laden carrier gas and an outer sheath gas or fluid. The sheath gas most commonly comprises compressed air or an inert gas, where one or both may contain a modified solvent vapor content. The sheath gas enters through the sheath air inlet below the aerosol inlet and forms an annular flow with the aerosol stream. Gas flow controller 12 preferably controls the sheath gas. The combined streams exit the chamber through an orifice directed at target 28. This annular flow focuses the aerosol stream onto target 28 and allows for deposition of features with dimensions as small as 10 microns or lower. The purpose of the sheath gas is to form a boundary layer that both focuses the aerosol stream and prevents particles from depositing onto the orifice wall. This shielding effect minimizes clogging of the orifices.

The diameter of the emerging stream (and therefore the linewidth of the deposit) is controlled by the orifice size, the ratio of sheath gas flow rate to carrier gas flow rate, and the spacing between the orifice and target 28. In a typical configuration, target 28 is attached to a platen that moves in two orthogonal directions under computer control via X-Y linear stages, so that intricate geometries may be deposited. An alternate configuration allows for deposition head 22 to move in two orthogonal directions while maintaining target 28 in a fixed position. Yet another configuration allows for movement of deposition head 22 in one direction, while target 28 moves in a direction orthogonal to that of deposition head 22. The process also enables the deposition of three-dimensional structures.

In the M³D® method, once the sheath gas is combined with the aerosol stream, the flow does not need to pass through more than one orifice in order to deposit sub-millimeter linewidths. In the deposition of a 10-micron line, the M³D® method typically achieves a flow diameter constriction of approximately 250, and may be capable of constrictions in excess of 1000, for this "single-stage" deposition. No axial constrictors are used, and the flows typically do not reach supersonic flow velocities, thus preventing the formation of turbulent flow, which could potentially lead to a complete constriction of the flow.

Aerosolization and Virtual Impaction

In the preferred operation of the system of the present invention detailed in FIG. 1a, Collison-type pneumatic atomizer 32 aerosolizes the material in the sample vial. The aerosol-laden gas stream is delivered to cross 30 that bridges atomizer 32, deposition head 22, exhaust flow controller 34, and pressure sensing transducer 36. Cross 30 is preferably configured so that the aerosol flow inlet is opposite the aerosol flow outlet. The outlet is connected to the M³D® deposition head. Excess carrier gas is preferably exhausted from the system 90° from the aerosol inlet/outlet line of travel. Mass flow controller 34 is preferably used to control the amount of gas that is exhausted from the system. Controlling the exhaust flow using a flow controller increases the precision of the deposition process by aiding in the control of the mass flux of the material that passes to the deposition head.

In an alternative embodiment, the atomizer is located directly adjacent to the virtual impactor. Positioning the virtual impactor near the pneumatic atomizer output results in the deposition of larger droplets, since the aerosol ultimately spends less time in transit from the atomizer to the target, and undergoes reduced evaporation. The deposition of larger droplets can produce a considerable effect on the characteristics of the deposited structure. In general, deposited structures formed from larger droplets show less particle overspray and improved edge definition when compared with structures deposited with small to moderate size droplets. The atomizer is optionally agitated to prevent material agglomeration.

Typically the carrier gas flowrate needed for pneumatic atomization must be reduced after the aerosol is generated, in order for the aerosol stream to be introduced into the deposition head. The required reduction in carrier gas flowrate—from as much as 2 L/min to as little as 10 ml/min—is preferably accomplished using a virtual impactor. However, the use of a virtual impactor may cause the system to be prone to clogging, decreasing the operating time of the apparatus to as little as several minutes, while undesirably decreasing the tolerance of the deposited structure. For example, the apparatus of FIG. 1b may deposit carbon-based resistors for as little as 15 minutes before failure, with a tolerance in the resistance values of as much as 30%. The apparatus of FIG. 1a, contrastingly, replaces the standard M³D® virtual impactor with cross 30 that exhausts excess carrier gas from the system, while minimizing the loss of particles and buildup of particles with the system. Cross 30 acts as a virtual impactor with considerably larger jet and collector orifice diameters than those used with the standard impactor. The use of larger jet and collector orifice diameters may increase the amount of material that flows through the virtual impactor minor flow axis, while minimizing the accumulation of material on the interior of the device.

Leak/Clog Sensor

Figure 2:
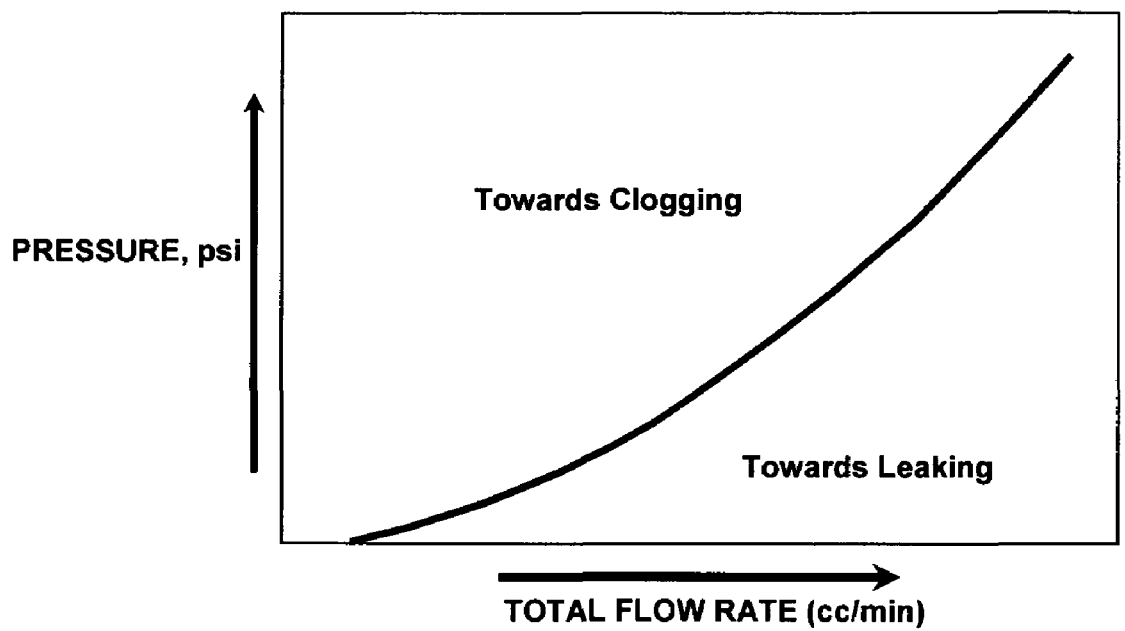

The present invention preferably uses a leak/clog sensor comprising pressure transducers to monitor the pressure developed at the atomizer gas inlet and at the sheath gas inlet. In normal operation, the pressure developed within the system is related to the total gas flow rate through the system, and can be calculated using a second-order polynomial equation. A plot of pressure versus total flow through the system is shown in FIG. 2. If the system pressure is higher than the pressure predicted by the curve of FIG. 2, a non-ideal flow may have developed within the system as a result of material accumulation. If the pressure is too low, a system leak is present, and material deposition may be inhibited or stopped entirely. The second order polynomial equation of the curve representing normal operation is of the form:

$$P = M_0 + M_1 Q + M_2 Q^2$$

where P is the sheath gas pressure and Q is the total flow rate. The total flow rate through the system is given by:

$$Q_{ultrasonic} = F_{sheath} + F_{ultrasonic}$$

$$Q_{pneumatic} = F_{sheath} + F_{pneumatic} - F_{exhaust}$$

where F is the device flow rate. The coefficients $M_0$, $M_1$, and $M_2$ are constants for each deposition tip diameter, but are variable with respect to atmospheric pressure.

The leak/clog sensor provides a valuable system diagnostic that can allow for continuous manual or automated monitoring and control of the system. When operating in an unassisted mode, the system may be monitored for clogs, and automatically purged when an increase in pressure beyond a pre-determined value is detected.

Mist Sensing

Quantitative measurement of the amount of aerosol generated by the atomizer units is critical for extended manual or automated operation of the M³D® system. Maintenance of a constant mist density allows for precision deposition, since the mass flux of aerosolized material delivered to the target can be monitored and controlled.

The system of the present invention preferably utilizes a mist sensor, which preferably comprises a visible wavelength laser whose beam passed through the aerosol outlet tube of the atomizer unit. The beam is preferably oriented perpendicular to the axis of the tube, and silicon photodiodes are preferably positioned adjacent to the tube on an axis perpendicular to both the axes of the tube and the laser. As the laser interacts with the mist flowing through the tube, light is scattered through a wide angle. The energy detected by the photodiodes is proportional to the aerosol density of the mist flow. As the mist flow rate increases, the photodiode output increases until a state of saturation is reached, at which the photodiode output becomes constant. A saturated mist level condition is preferred for constant mist output, so that a constant photodiode output indicates an optimum operating condition.

In a feedback control loop, the output of the photodiodes is monitored and can be used to determine the input power to the ultrasonic atomizer transducer.

Processing

The aerosolized material compositions may be processed in-flight—during transport to the deposition head 22 (pre-processing)—or once deposited on the target 28 (post-processing). Pre-processing may include, but is not limited to, humidifying or drying the aerosol carrier gas or the sheath gas. The humidification process may be accomplished by introducing aerosolized droplets and/or vapor into the carrier gas flow. The evaporation process is preferably accomplished using a heating assembly to evaporate one or more of the solvent and additives.

Post-processing may include, but is not limited to using one or a combination of the following processes: (1) thermally heating the deposited feature, (2) subjecting the deposited feature to a reduced pressure atmosphere, or (3) irradiating the feature with electromagnetic radiation. Post-processing of passive structures generally requires temperatures ranging from approximately 25 to 1000° C. Deposits requiring solvent evaporation or cross-linking are typically processed at temperatures of approximately 25 to 250° C. Precursor or nanoparticle-based deposits typically require processing temperatures of approximately 75 to 600° C., while commercial fireable pastes require more conventional firing temperatures of approximately 450 to 1000° C. Commercial polymer thick film pastes are typically processed at temperatures of approximately 25° to 250° C. Post-processing may optionally take place in an oxidizing environment or a reducing environment. Subjecting the deposit to a reduced pressure environment before or during the heating step, in order to aid in the removal of solvents and other volatile additives, may facilitate processing of passive structures on heat-sensitive targets.

Two preferred methods of reaching the required processing temperatures are by heating the deposit and target on a heated platen or in a furnace (thermal processing), or by irradiating the feature with laser radiation. Laser heating of the deposit allows for densification of traditional thick film pastes on heat-sensitive targets. Laser photochemical processing has also been used to decompose liquid precursors to form mid to high-range resistors, low to mid-range dielectric films, and highly conductive metal. Laser processing may optionally be performed simultaneously with deposition. Simultaneous deposition and processing can be used to deposit structures with thicknesses greater than several microns, or to build three-dimensional structures. More details on laser processing may be found in commonly-owned U.S. patent application Ser. No. 10/952,108, entitled "Laser Processing For Heat-Sensitive Mesoscale Deposition", filed on Sep. 27, 2004, the specification and claims of which are incorporated herein by reference.

Thermally processed structures have linewidths that are partially determined by the deposition head and the deposition parameters, and have a minimum linewidth of approximately 5 microns. The maximum single pass linewidth is approximately 200 microns. Linewidths greater than 200 microns may be obtained using a rastered deposition technique. Laser-processed lines may have linewidths ranging from approximately 1 to 100 microns (for a structure deposited with a single pass). Linewidths greater than 100 microns may be obtained using a rastered processing technique. In general, laser processing is used to densify or to convert films deposited on heat-sensitive targets, such as those with low temperature thresholds of 400° C. or less, or when a linewidth of less than approximately 5 microns is desired. Deposition of the aerosol stream and processing may occur simultaneously.

Types of Structures: Material Compositions

The present invention provides a method for precision fabrication of passive structures, wherein the material composition includes, but is not limited to, liquid chemical precursors, inks, pastes, or any combination thereof. Specifically, the present invention can deposit electronic materials including but not limited to conductors, resistors, dielectrics, and ferromagnetic materials. Metal systems include, but are not limited to, silver, copper, gold, platinum, and palladium, which may be in commercially available paste form. Resistor compositions include, but are not limited to, systems composed of silver/glass, ruthenates, polymer thick films formulations, and carbon-based formulations. Formulations for deposition of capacitive structures include, but are not limited to, barium titanate, barium strontium titanate, aluminum oxide, and tantalum oxide. Inductive structures have been deposited using a manganese/zinc ferrite formulation blended with low-melting temperature glass particles. The present invention can also blend two uv-curable inks to produce a final composition with a targeted characteristic, such as a specific refractive index.

A precursor is a chemical formulation consisting of a solute or solutes dissolved in a suitable solvent. The system may also contain additives that alter the fluid, chemical, physical, or optical properties of the solution. Inks may be comprised of particles, including but not limited to metal nanoparticles or metal nanoparticles with glass inclusions, of an electronic material suspended in a fluid medium. Depositable pastes include, but are not limited to, commercially available paste formulations for conductive, resistive, dielectric, and inductive systems. The present invention can also deposit commercially available adhesive pastes.

Resistors

A silver/glass resistor formulation may be composed of a liquid molecular precursor for silver, along with a suspension of glass particles, or silver and glass particles, or silver particles in a liquid precursor for glass. A ruthenate system may be comprised of conductive ruthenium oxide particles and insulating glass particles, ruthenium oxide particles in a precursor for glass, or a combination of a ruthenium oxide precursor and a precursor for glass or an insulating medium. Precursor compositions and some precursor/particle compositions may have viscosities of approximately 10 to 100 cP, and may be aerosolized ultrasonically. Resistor pastes may be comprised of either or both of ruthenates, polymer thick film formulations, or carbon-based formulations. Commercially available ruthenate pastes, typically consisting of ruthenium oxide and glass particles, having viscosities of 1000 cP or greater, may be diluted with a suitable solvent such as terpineol to a viscosity of 1000 cP or less. Polymer thick film pastes may also be diluted in a suitable solvent to a similar viscosity, so that pneumatic aerosolization and flow-guidance is enabled. Similarly, carbon-based pastes can be diluted with a solvent such as butyl carbitol to a viscosity of approximately 1000 cP or less. Therefore, many commercial paste compositions with viscosities greater than 1000 cP may be modified and deposited using the M³D® process.

Resistors: Range of Resistance, Repeatability, and Temperature Coefficient of Resistance The resistive structures deposited using the M³D® process may comprise a resistance spanning approximately six orders of magnitude, from 1 ohm to 1 Mohm. This range of resistance values may be obtained by depositing the appropriate material with the appropriate geometrical cross-sectional area. The tolerance or variance of the resistance values—defined as the ratio of the difference in the resistance value of the highest and lowest passive structure and the average resistance value, for a set of deposits—may be as low as 2 percent. The temperature coefficient of resistance (TCR) for Ag/glass and ruthenate structures may range from approximately ±50 to ±100 ppm.

Geometry

Figure 3A:
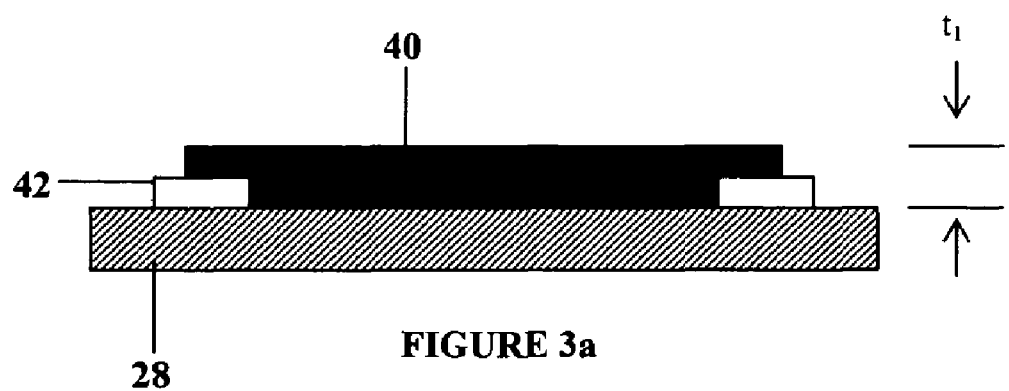
Figure 3B:
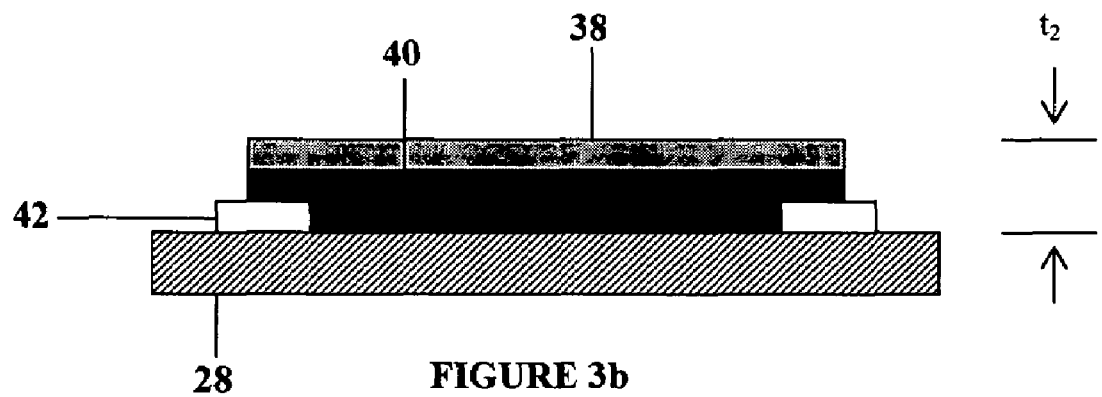
Figure 4:
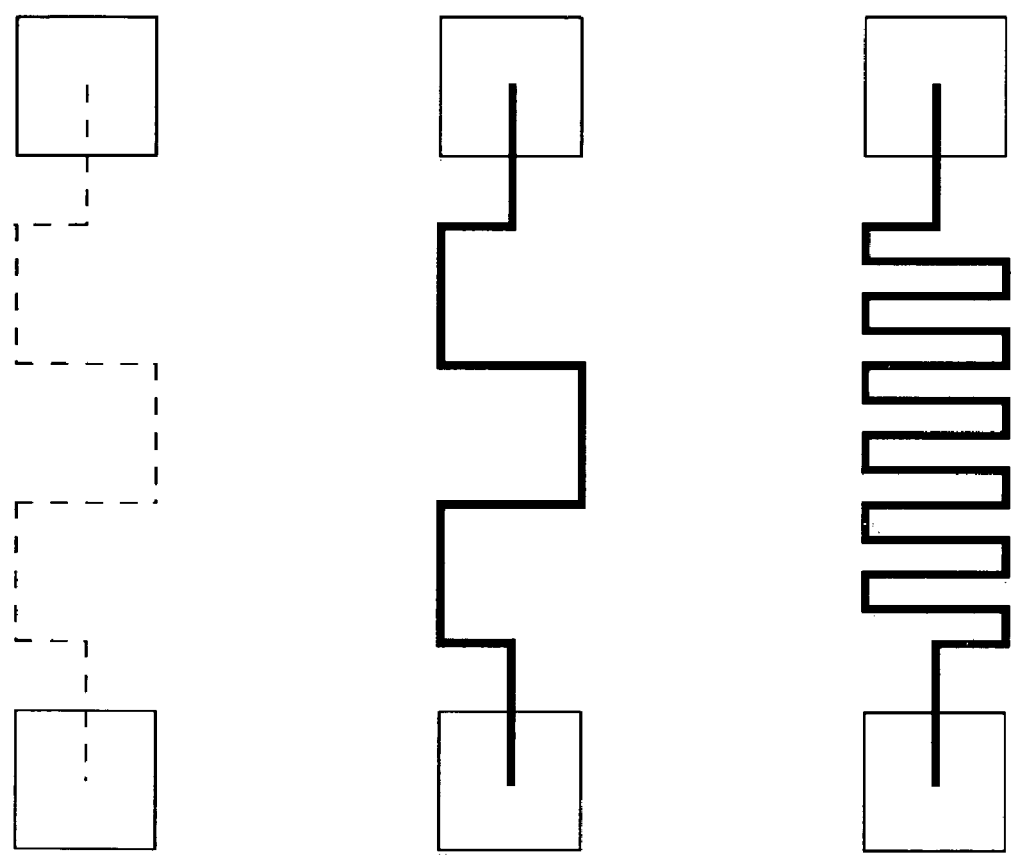
Figure 5A:
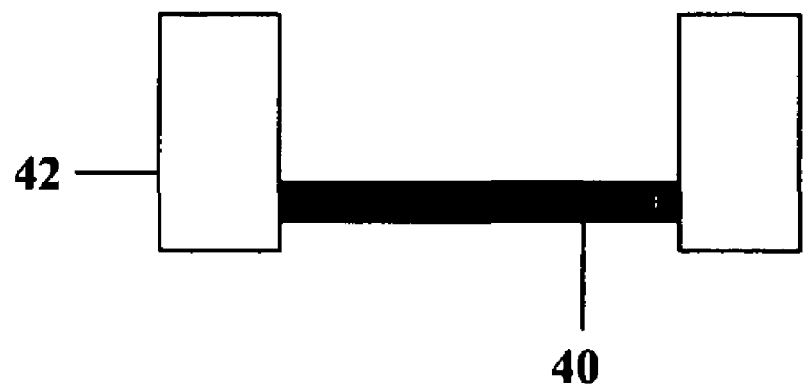
Figure 5B:
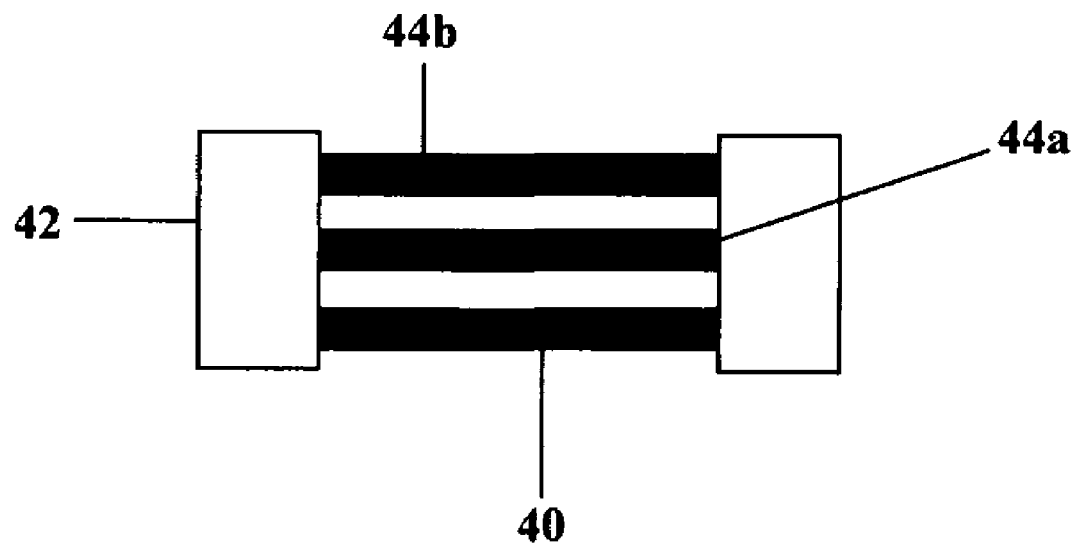
Figure 6:
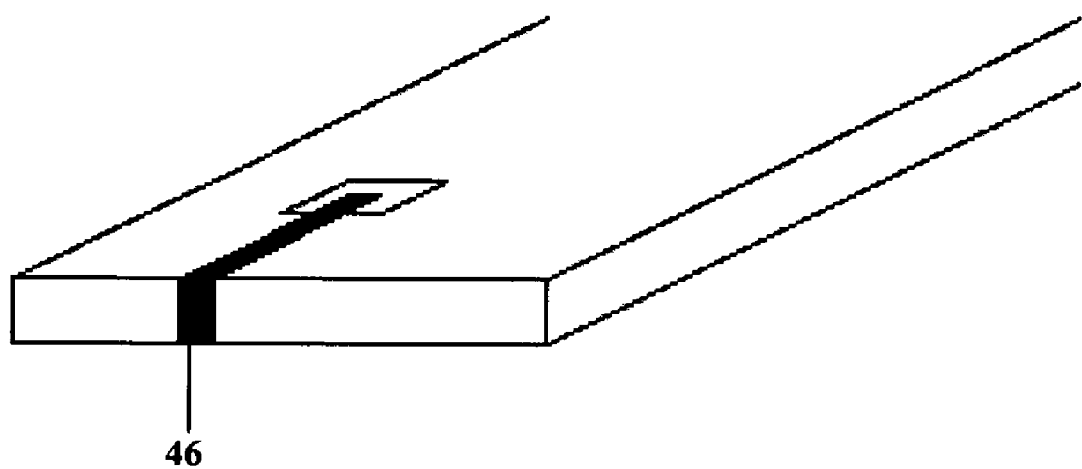

The present method is capable of producing a specific electronic, optical, physical, or chemical value of a structure by controlling the geometry of the deposit. For example, properties of a structure can be altered by controlling the cross-sectional area of the structure, as shown in FIGS. 3a and 3b. Resistance values may be altered by adding material to an existing trace, thereby increasing the cross sectional area of the total trace, thus decreasing the resistance value as material is added to the existing trace. This method is analogous to commonly used laser trimming methods, however material is added rather than removed. The additively trimmed passive trace 38 is deposited onto the existing passive trace 40. As a further example, a specific value may be obtained by controlling the length of a deposited structure; as shown in FIG. 4, the rightmost resistor has a greater resistance than the middle structure, by virtue of the greater length of resistor material between the contact pads. The method of the present invention may also be used to add material to a set of traces or between one or more sets of contact pads 42 connected to a pre-existing electronic circuit, as shown in FIGS. 5a and 5b. Ladder passive traces 44a-b are added to existing passive trace 40. This method enables tuning of the circuit to a specific response or characteristic value. The method is also capable of creating passive structures between layers of circuitry by making passive connections in vias, or by wrapping resistor material 46 around the edge of circuit layers, as shown in FIG. 6.

Figure 7A:
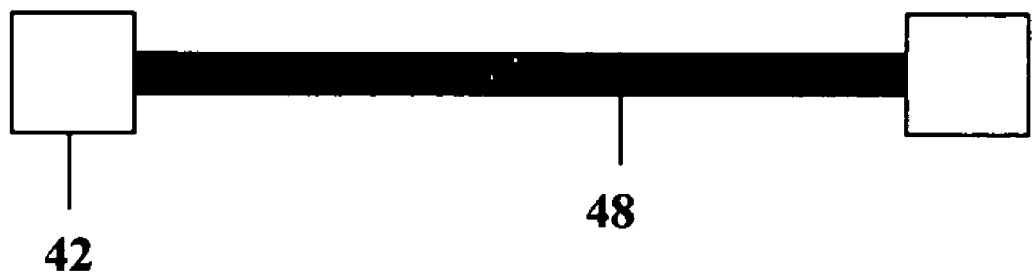
Figure 7B:
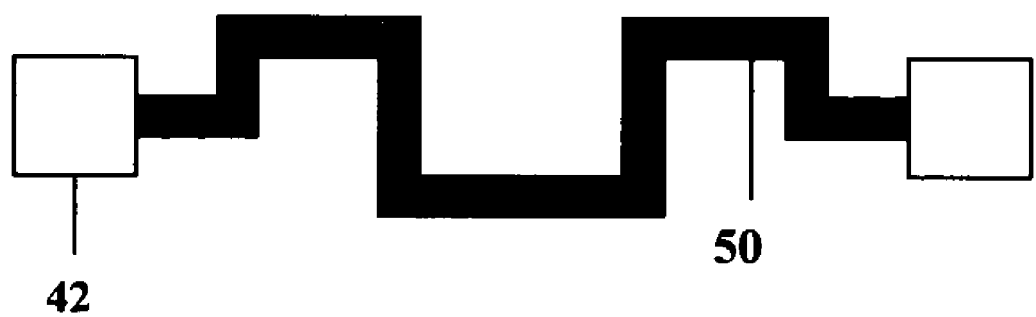

The passive structures deposited using the M³D® process of the present invention typically have linear geometries, such as the linear passive trace 48 shown in FIG. 7a. Other geometries include, but are not limited to, serpentine 50 (as shown in FIG. 7b), spiral, and helical patterns. Linewidths of deposited resistor material typically range from approximately 10 to 200 microns, but could be greater or lower. Linewidths greater than 200 microns may be obtained by depositing material in a rastered fashion. The thickness of the deposited film may range from a few hundred nanometers to several microns.

Via Filling

The M³D® process can be used to fill vias, providing electrical interconnectivity between adjacent layers of an electronic circuit. The present invention allows for the precise, uniform deposition of an aerosolized material over an extended period of time, for example into via holes.

Figure 8:
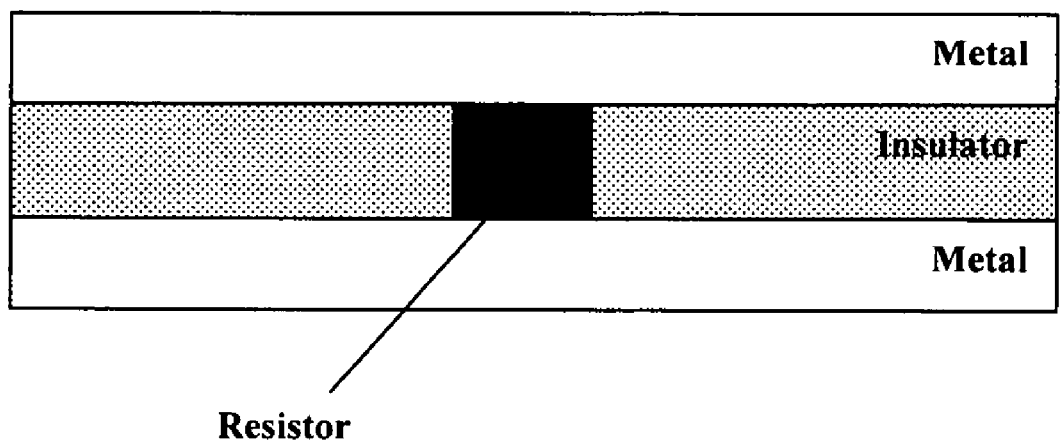

FIG. 8 shows a resistive connection between different layers of circuitry. Conductive layers in a PCB (printed circuit board) are typically connected by metal vias, however, the M³D® process also allows for deposition of resistive structures into vias. The resistive via configuration is advantageous since, by moving the layer resistors into vias, additional space is provided on the surface of the circuit board layers.

Figure 9A:
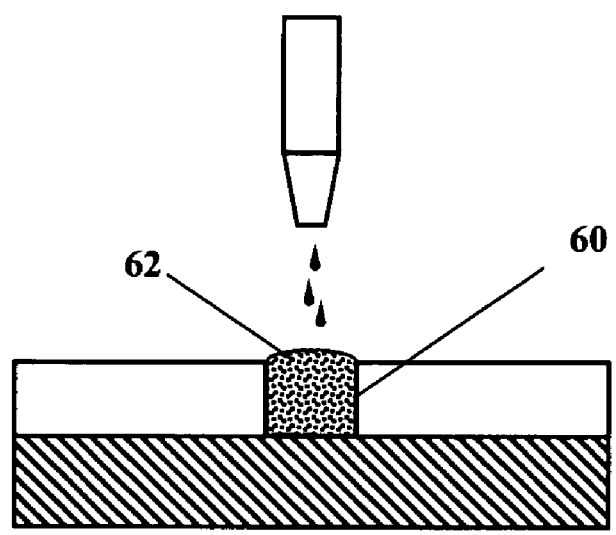
Figure 9B:
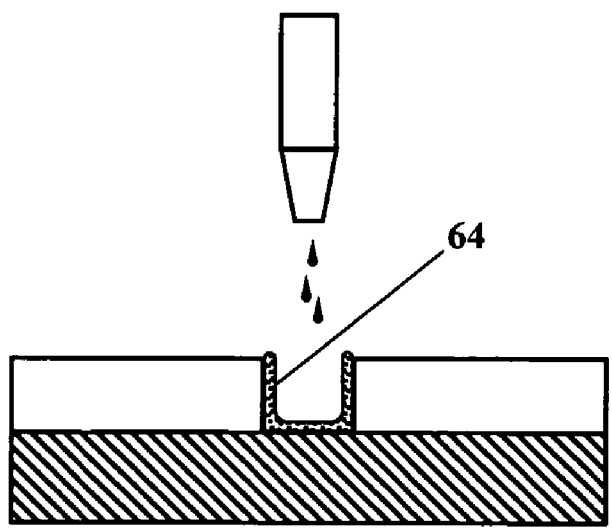

FIG. 9 depicts a method for depositing a coating on the walls and bottom of a via. In FIG. 9a, via 60 is completely filled with ink 62 using the process of the present invention. As ink 62 dries, the solids 64 will adhere onto the walls and the bottom of the via, leaving the middle of the via hollow, as shown in FIG. 9b. Coating the wall with highly conductive material results in a very useful structure, because most of the current in a via flows along the wall and not through the middle.

Dielectrics

In the case of fabrication of dielectric structures, an ink can be comprised of a precursor for an insulator, such as polyimide, while a paste may be a formulation containing dielectric particles and low melting temperature glass inclusions. The precision deposition offered by the present invention is critical to fabrication of high tolerance capacitors, since the thickness and uniformity of a capacitive film determines the capacitance and the performance of the capacitor. Low-k dielectric materials such as glass and polyimide have been deposited for dielectric layers in capacitor applications, and as insulation or passivation layers deposited to isolate electronic components. Mid-k and high-k dielectrics such as barium titanate can be deposited for capacitor applications.

Etch Resist

Figure 10A:
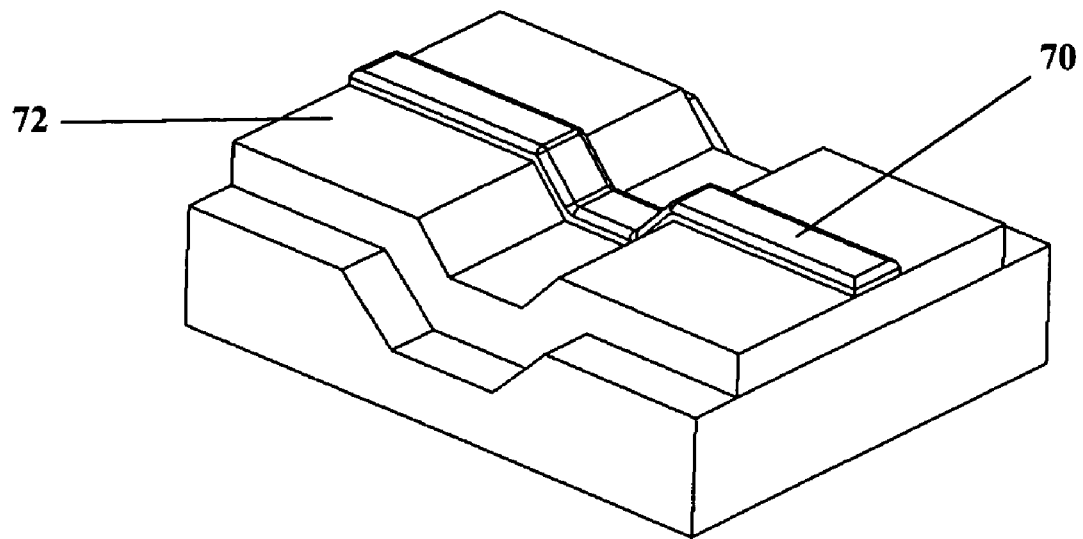
Figure 10B:
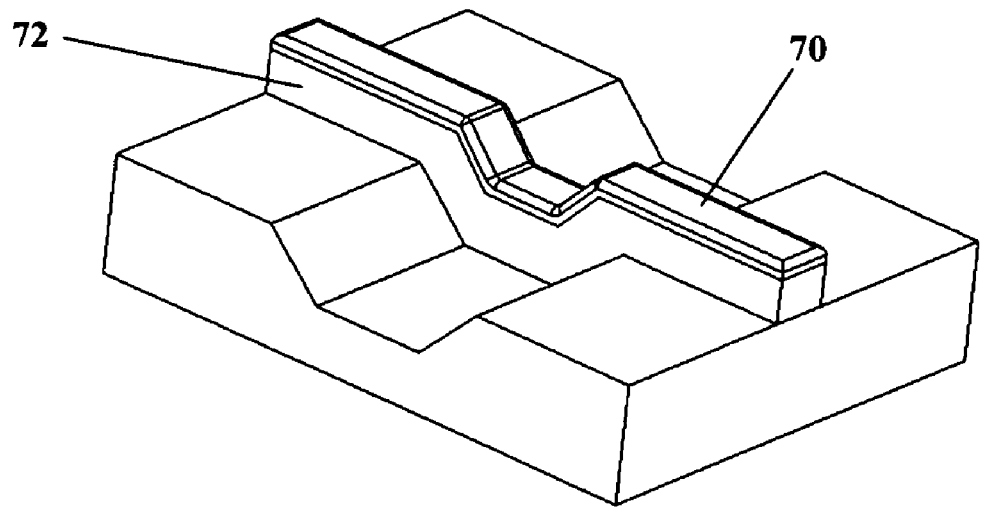
Figure 10C:
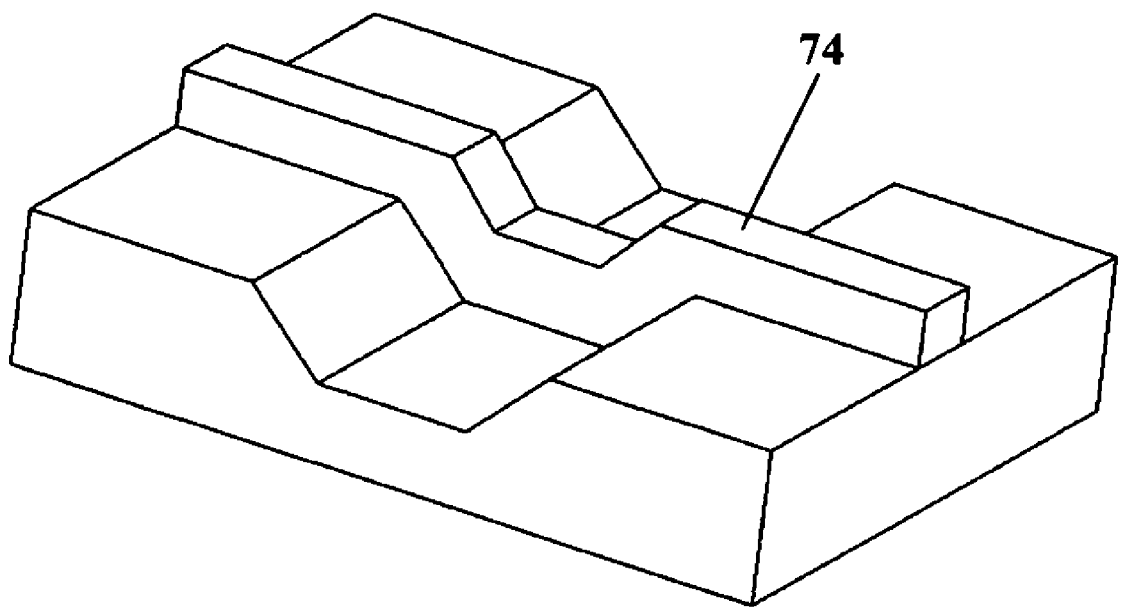

The present embodiment of the $M^3D$® process may be used in a hybrid additive/subtractive technique to fabricate precision metal structures using an etch resist. Etch resist 70 is preferably atomized and deposited through the deposition head onto metal layer 72, as shown in FIG. 10a. A subtractive technique, for example etching, is then used to remove the exposed metal, FIG. 10b. In the last step, the etch resist is removed, leaving metal structure 74 on the underlying substrate, FIG. 10c. The additive/subtractive etch resist process can be used to deposit reactive metals such as copper.

Targets

Targets suitable for direct write of passive structures using the $M^3D$® process include, but are not limited to, polyimide, FR4, alumina, glass, zirconia, and silicon. Processing of resistor formulations on polyimide, FR4, and other targets with low temperature damage thresholds, i.e. damage thresholds of approximately 400° C. or less, generally requires laser heating to obtain suitable densification. Laser photochemical processing may be used to direct write mid to high range resistor materials such as strontium ruthenate on polyimide.

Applications

Applications enabled by fabrication of passive structures using the $M^3D$® process include, but are not limited to, direct write resistors for electronic circuits, heating elements, thermistors, and strain gauges. The structures may be printed on the more conventional high-temperature targets such as alumina and zirconia, but may also be printed on heat-sensitive targets such as polyimide and FR4. The $M^3D$® process may also be used to print embedded passive structures onto pre-existing circuit boards, onto planar or non-planar surfaces, and into vias connecting several layers of a three-dimensional electronic circuit. Other applications include, but are not limited to, blending passive element formulations to produce a deposited structure with a specific physical, optical, electrical, or chemical property; repair of passive structures on pre-populated circuit boards; and deposition of passive structures onto pre-populated targets for the purpose of altering the physical, optical, electrical, or chemical performance of a system. The present invention enables the above applications with tolerances in physical or electrical properties of 5% or less.

Although the present invention has been described in detail with reference to particular preferred and alternative embodiments, persons possessing ordinary skill in the art to which this invention pertains will appreciate that various modifications and enhancements may be made without departing from the spirit and scope of the Claims that follow, and that other embodiments can achieve the same results. The various configurations that have been disclosed above are intended to educate the reader about preferred and alternative embodiments, and are not intended to constrain the limits of the invention or the scope of the Claims. Variations and modifications of the present invention will be obvious to those skilled in the art and it is intended to cover all such modifications and equivalents. The entire disclosures of all patents and publications cited above are hereby incorporated by reference.

What is claimed is:

1. A method of depositing a passive structure comprising a material on a target, the method comprising the steps of:
    atomizing the material;
    entraining the atomized material in a carrier gas to form an aerosol;
    removing excess carrier gas from the aerosol using a flow controller;
    monitoring a pressure of said aerosol;
    surrounding the aerosol with a sheath gas and subsequently passing the aerosol through no more than one orifice;
    focusing the aerosol; and
    depositing the material entrained in the carrier gas on the target with a sub-millimeter deposition linewidth;
    wherein a tolerance of a physical or electrical property of the passive structure is better than approximately 5%.

2. The method of claim 1 further comprising the step of determining the existence of a leak or clog based on a value of the pressure.

3. The method of claim 2 further comprising the step of automatically purging the system if a clog exists.

4. The method of claim 2 further comprising the step of automatically ceasing operation if a leak exists.

5. The method of claim 1 further comprising the steps of shining a laser beam into the aerosol and measuring scattered light from the laser beam.

6. The method of claim 5 wherein the measuring step is performed by a detector oriented orthogonally to both the laser beam and a flow direction of the aerosol.

7. The method of claim 5 further comprising the step of varying the power used in the atomizing step based on an amount of scattered light detected in the measuring step.

8. The method of claim 1 further comprising the step of processing the material.

9. The method of claim 8 wherein the processing step is selected from the group consisting of humidifying the aerosol, drying the aerosol, heating the aerosol, heating the deposited material, irradiating the deposited material with a laser beam, and combinations thereof.

10. The method of claim 9 wherein irradiating the deposited material with a laser beam enables a linewidth of the deposited material to be as low as approximately 1 micron.

11. The method of claim 9 wherein irradiating the deposited material with a laser beam does not raise an average temperature of the target to above a damage threshold.

* * * * *